United States Patent
Okumura

(10) Patent No.: US 10,490,628 B2
(45) Date of Patent: Nov. 26, 2019

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Hideki Okumura, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/916,355

(22) Filed: Mar. 9, 2018

(65) Prior Publication Data

US 2019/0148488 A1 May 16, 2019

(30) Foreign Application Priority Data

Nov. 15, 2017 (JP) .................................. 2017-220305

(51) Int. Cl.
 *H01L 29/06* (2006.01)
 *H01L 29/423* (2006.01)
 *H01L 29/78* (2006.01)

(52) U.S. Cl.
 CPC ...... *H01L 29/0653* (2013.01); *H01L 29/0615* (2013.01); *H01L 29/4236* (2013.01); *H01L 29/7827* (2013.01)

(58) Field of Classification Search
 CPC .................................................. H01L 29/0669
 See application file for complete search history.

(56) References Cited

U.S. PATENT DOCUMENTS

| | | | | |
|---|---|---|---|---|
| 5,973,360 A | * | 10/1999 | Tihanyi | H01L 29/0653 257/330 |
| 6,740,931 B2 | | 5/2004 | Kouzuki et al. | |
| 8,390,060 B2 | * | 3/2013 | Darwish | H01L 29/167 257/330 |
| 8,592,917 B2 | * | 11/2013 | Ono | H01L 29/0634 257/396 |
| 8,889,532 B2 | * | 11/2014 | Burke | H01L 29/407 438/489 |

(Continued)

FOREIGN PATENT DOCUMENTS

| | | |
|---|---|---|
| JP | 2003-309261 A | 10/2003 |
| JP | 2004-335869 A | 11/2004 |
| JP | 2007-129086 A | 5/2007 |

OTHER PUBLICATIONS

Zhen Cao, "A Superjunction U-MOSFET With SIPOS Pillar Breaking Superjunction Silicon Limit by TCAD Simulation Study," IEEE Electron Device Letters, vol. 38, No. 6, Jun. 2017, pp. 794-797.

*Primary Examiner* — Mounir S Amer
(74) *Attorney, Agent, or Firm* — White & Case LLP

(57) ABSTRACT

A semiconductor device has a drain region of a first conductivity type; a first semiconductor region of the first conductivity type on the drain region; a MOSFET on an upper part of the first semiconductor region; a source electrode configured to cover the MOSFET; and a pair of electrical connection units on both sides of the first semiconductor region, the electrical connection units being configured to electrically connect the drain region and the source electrode while being electrically insulated from the first semiconductor region.

18 Claims, 10 Drawing Sheets

(56) References Cited

U.S. PATENT DOCUMENTS

| | | | |
|---|---|---|---|
| 2009/0140327 A1* | 6/2009 | Hirao | H01L 29/407 257/328 |
| 2009/0218621 A1* | 9/2009 | Pfirsch | H01L 29/0634 257/342 |
| 2012/0168819 A1* | 7/2012 | Marino | H01L 29/7828 257/192 |

* cited by examiner

SEMICONDUCTOR DEVICE

CROSS-REFERENCE TO RELATED APPLICATIONS

This application is based upon and claims the benefit of priority from Japanese Patent Application No. 2017-220305, filed on Nov. 15, 2017; the entire contents of which are incorporated herein by reference.

FIELD

An embodiment of the present invention relates to a semiconductor device.

BACKGROUND

A MOSFET (metal oxide semiconductor field effect transistor) having a super-junction structure is known in a semiconductor device with a medium breakdown voltage and a semiconductor device with a high breakdown voltage. In this super-junction structure, a vertical p-type semiconductor region is provided inside an n-type semiconductor region so as to form a depletion layer, which has uniform electric field intensity, at an interface between n-type and p-type semiconductor regions, thereby ensuring a breakdown voltage. A MOSFET with such a structure is characterized in that on-resistance is smaller than that of a MOSFET with a normal structure.

However, with recent improvements in performance of semiconductor devices, it has been required to control an impurity concentration of an n-type semiconductor region and that of a p-type semiconductor region with high accuracy, which causes a problem such as a high-cost manufacturing process. Therefore, in the manufacturing process, it has been desired to obtain a semiconductor device capable of achieving low resistance without controlling impurity concentrations of n-type and p-type semiconductor regions with high accuracy.

DETAILED DESCRIPTION

Figure 1:
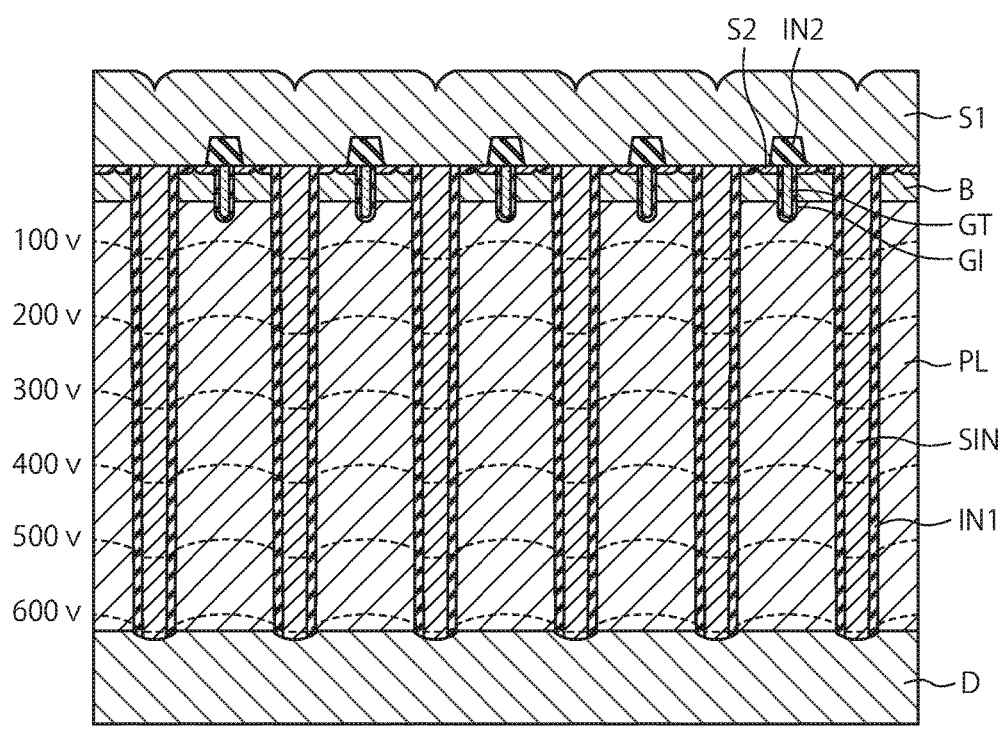
FIG. 1 is a cross-sectional view illustrating a configuration of a semiconductor device according to a first embodiment.

Hereinafter, a semiconductor device and a method for manufacturing the same according to an embodiment will be described with reference to the drawings. In the following description, components having substantially similar functions and configurations are denoted with the same reference numerals, and redundant explanation will be given if required.

It should be noted that the drawings are schematic or conceptual views, and a relationship between thickness and width of each part as well as a ratio of sizes between parts are not necessarily the same as the actual ones. Even when indicating an identical part, dimensions and ratios of the part may be indicated differently depending on the drawings.

In the description of each embodiment, the terms "above and below, "on and beneath", "upper part and lower part" are used appropriately according to orientations of the drawings, but these terms are used for sake of illustration of the configuration of the semiconductor device. It should be noted that a vertical direction can be changed to any directions depending on directions in which the semiconductor device is viewed or depending on aspects of a specification of the semiconductor device.

Furthermore, in the following description, the notations n+, n, n⁻, and p represent a relative increase or decrease of an impurity concentration in each conductivity type. In other words, the notation with "+" indicates that the impurity concentration is relatively higher than the notation without "+" or "−", and the notation with "−" indicates that the impurity concentration is relatively lower than the notation without "+" or "−". In each the following embodiments, each embodiment may be carried out by reversing an n-type (first conductivity type) and a p-type (second conductivity type) of each semiconductor region.

First Embodiment

In regard to a semiconductor device according to a first embodiment, a source electrode and a drain region are connected to each other through an electrical connection unit including a high-resistance conductive film in a MOSFET with a super-junction structure. Accordingly, equipotential distribution is formed in the conductive film so that a depletion layer formed in a semiconductor region located below the MOSFET extends toward the drain region. Thus, a breakdown voltage of each MOSFET is enhanced. The details will hereinafter be described.

Figure 2:
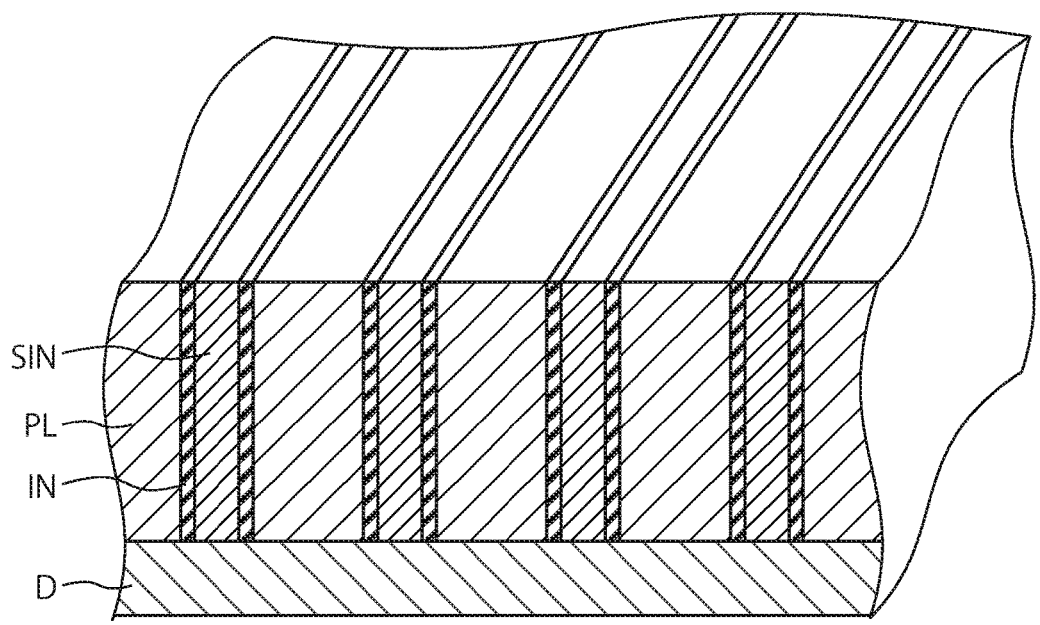
FIG. 2 is a partial perspective view of the semiconductor device illustrated in FIG. 1.

FIG. 1 is a cross-sectional view of the semiconductor device according to this embodiment, illustrating a configuration of the semiconductor device. As illustrated in FIG. 1, the semiconductor device according to this embodiment includes a plurality of MOSFETs having a super-junction structure. FIG. 2 is a partial perspective view of the semiconductor device according to this embodiment.

Specifically, the semiconductor device includes a drain region D, a gate region GT, a gate insulating film GI, a source electrode S1, a source region S2, a base region B, a pillar PL, an insulating film IN1, an interlayer insulating film IN2, and a high-resistance conductive film SIN.

The drain region D is an n$^+$-type semiconductor layer, including, for example, an n$^+$-type semiconductor substrate. Between the drain region D and the source electrode S1, there are provided the n-type pillar PL, the high-resistance conductive film SIN that electrically connects the drain region D and the source electrode S1, and the insulating film IN1 that covers the periphery of the conductive film SIN. In other words, as can be seen from the perspective view in FIG. 2, both sides of the n-type pillar PL are electrically separated by the insulating film IN1 from the conductive film SIN and other pillars PL.

The conductive film SIN is also referred to as a semi-insulating film, including an extremely high-resistance material. In this embodiment, for example, it is assumed that resistance of the conductive films SIN, that is, electrical resistance between the drain region D and the source electrode S1 of the semiconductor device as a whole is ranging from $10^7 \Omega$ to $10^{10} \Omega$. Therefore, an infinitesimal amount of currents flows from the drain region D to the source electrode S1. From a technical point of view, resistance lower than $10^7 \Omega$ increases the currents flowing from the drain region D to the source electrode S1, which leads to an increase in wasted consumption currents and heat generation. On the other hand, resistance higher than $10^{10} \Omega$ flows substantially no currents so that it is thought to be difficult to form the after-mentioned equipotential distribution appropriately. In other words, the currents flowing between the drain region D and the source electrode S1 is considered as leakage currents, and a technically allowable amount of currents is in the order of several tens of μA at a maximum. When the leakage currents are to be suppressed within this range, a lower limit value is set to about $10^7 \Omega$.

For example, assuming that 600V is applied to the drain region D and the source electrode S1 is connected to the ground (0V), the allowable leakage currents of the semiconductor device as a whole is considered 60 nA through 60 μA. According to the ohm's law, an upper limit of the resistance R is Voltage V/Leakage Current A=600/(60× $10^{-9}$)=1×$10^{10} \Omega$ and a lower limit of the resistance R is Voltage V/Leakage Current A=600/(60×$10^{-6}$)=1×$10^{-7} \Omega$. This result coincides with the range derived from the technical point of view mentioned above.

End portions of the insulating film IN1 and the conductive film SIN close to the drain region D are formed so as to extend into the drain region D. Therefore, the pillar PL and the conductive film SIN are electrically insulated so as not to allow currents from the pillar PL to flow into the conductive film SIN or allow currents from the conductive film SIN to flow into the pillar PL.

The p-type base region B is formed on an upper part of the n-type pillar PL. The n-type source region S2 is formed on a surface of the p-type base region B. Penetrating the source region S2 and the base region B, the gate region GT is formed on the n-type source region S2, the p-type base region B and the n-type pillar PL via the gate insulating film GI.

Furthermore, the interlayer insulating film IN2 is formed on the gate insulating film GI. Therefore, the gate region GT is electrically insulated from the source region S2 and the base region B. The source region S2 is electrically connected to the source electrode S1.

The pillar PL corresponds to a first semiconductor region according to this embodiment; the insulating film IN1 corresponds to a first insulating film according to this embodiment; the base region B corresponds to a second semiconductor region according to this embodiment; and the gate insulating film GI corresponds to a second insulating film according to this embodiment. The n-type corresponds to a first conductivity type in this embodiment; and the p-type corresponds to a second conductivity type in this embodiment. Furthermore, the conductive film SIN and the insulating film IN1 are included in the electrical connection unit according to this embodiment; and the base region B, the source region S2, the gate region GT, and the pillar PL are included in the MOSFET according to this embodiment.

Therefore, looking at one pillar PL, a pair of electrical connection units are formed on both sides of the pillar PL. Since the insulating film IN1 is provided on both sides of the conductive film SIN, the electrical connection units electrically connect the drain region D and the source electrode S1, while being electrically insulated from the pillar PL. As can be seen from FIG. 1, the conductive film SIN is configured to be filled between the insulating film IN1 and the insulating film IN1.

Hereinafter, operations of the semiconductor device illustrated in FIG. 1 will be described. In this embodiment, for example, it is assumed that 600 V is applied to the drain region D and that the source electrode S1 is grounded (0 V). In this state, when a positive voltage equal to or larger than a threshold is applied to the gate region GT, a channel is formed in the p-type base region B, and electrons flow from the source region S2 to the drain region D through the pillar PL. In other words, a MOSFET of interest is switched from the off state to the on state.

Regardless of whether the MOSFET is on or off, an infinitesimal amount of currents flows in the high-resistance conductive film SIN from the drain region D to the source electrode S1. In other words, electrons move from the source electrode S1 toward the drain region D. As described above, the insulating film IN1 is formed in the periphery of the conductive film SIN so that the currents flowing through the conductive film SIN do not theoretically flow into the pillar PL. Accordingly, the currents flowing through the conductive film SIN, or some sort of leakage currents, are maintained at the infinitesimal amount.

Since the infinitesimal amount of currents flows through the high-resistance conductive film SIN, the equipotential distribution of 0 V to 600 V is formed in the conductive film SIN. FIG. 1 schematically illustrates the equipotential distribution of 100 V, 200 V, 600 V. Due to the equipotential distribution formed in the high-resistance conductive film SIN, the depletion layer formed in the n-type pillar PL is also drawn toward the drain region D. Particularly, due to miniaturization of semiconductor devices in recent years, MOSFETs are placed more and more closely to each other so that the depletion layer formed in the n-type pillar PL is kept apart from the MOSFETs. That is, if a distance of MOSFETs is faraway from each other, the central portion of the equipotential distribution of the pillar PL between the conductive films SIN is closed to the base region B and it is impossible to extend the depletion layer toward the drain region D even if the equipotential distribution is formed in the conductive film SIN. On the other hand, if the distance of MOSFETs is closely to each other, the central portion of equipotential distribution of the pillar PL between the conduct films SIN is apart from the base region B and it is possible to draw the depletion layer toward the drain region D. Therefore, it is possible to enhance the breakdown voltage of the MOSFET.

Hereinafter, a method for manufacturing the semiconductor device according to this embodiment will be described with reference to FIGS. 3 to 8.

FIGS. 3 to 8 are cross-sectional views illustrating the manufacturing process of the semiconductor device according to this embodiment.

Figure 3:
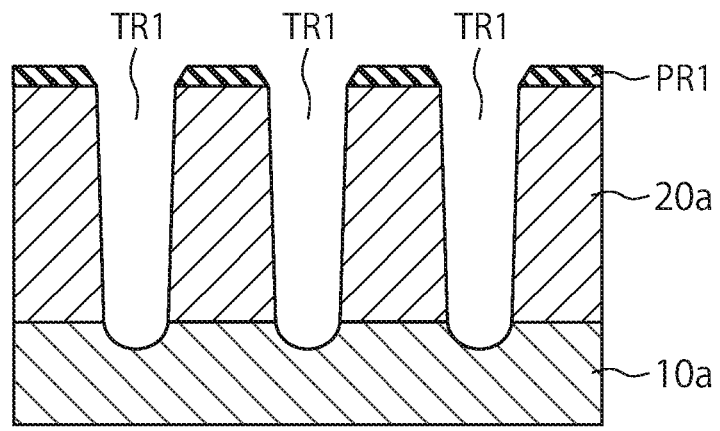
FIG. 3 is a cross-sectional view illustrating a manufacturing process of the semiconductor device according to the first embodiment.

First, as illustrated in FIG. 3, an n⁻-type semiconductor layer 20a is formed on an n⁺-type semiconductor layer 10a. Next, a photoresist layer PR1 is formed on the n⁻-type semiconductor layer 20a, being patterned. Using this patterned photoresist layer PR1 as a mask, the n⁻-type semiconductor layer 20a and the n⁺-type semiconductor layer 10a are etched, for example, by RIE (reactive ion etching) method. Accordingly, a trench TR1 is formed. The trench TR1 extends into the n⁺-type semiconductor layer 10a through the n⁻-type semiconductor layer 20a. In other words, the n⁺-type semiconductor layer 10a is exposed at the bottom of the trench TR1.

Figure 4:
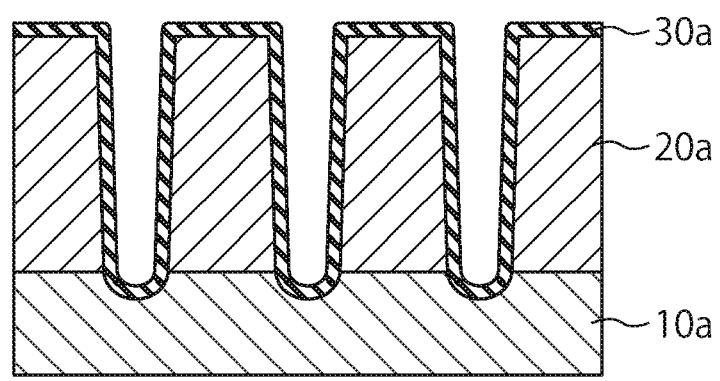
FIG. 4 is a cross-sectional view illustrating the manufacturing process of the semiconductor device according to the first embodiment.

Next, as illustrated in FIG. 4, the photoresist layer PR1 is removed, and a sidewall oxide film 30a is formed, for example, by thermal oxidation. Accordingly, the sidewall oxide film 30a is formed on a surface of the n⁻-type semiconductor layer 20a and a surface of the n⁺-type semiconductor layer 10a exposed at the bottom of the trench TR1.

Figure 5:
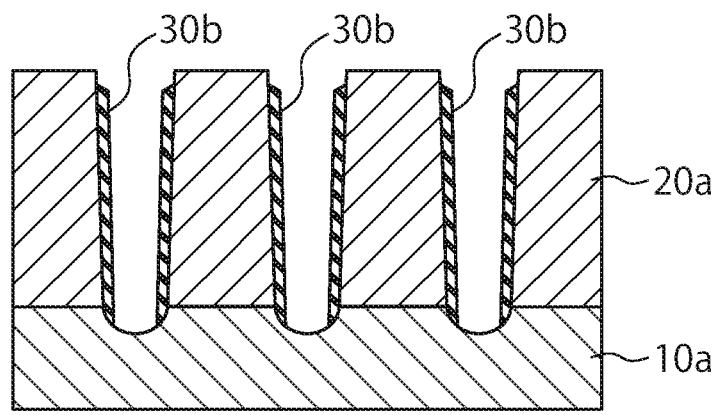
FIG. 5 is a cross-sectional view illustrating the manufacturing process of the semiconductor device according to the first embodiment.

Next, as illustrated in FIG. 5, the sidewall oxide film 30a is etched back, for example, by RIE method so that the sidewall oxide film 30a is partially removed so as to form a sidewall oxide film 30b. In other words, the sidewall oxide film 30a formed on the upper surface of the n⁻-type semiconductor layer 20a and the sidewall oxide film 30a formed at the bottom of the trench TR1 are removed by etching. Accordingly, the n⁺-type semiconductor layer 10a is re-exposed at the bottom of the trench TR1.

Figure 6:
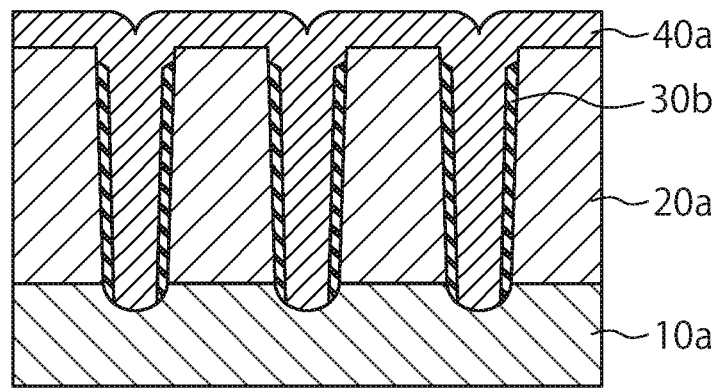
FIG. 6 is a cross-sectional view illustrating the manufacturing process of the semiconductor device according to the first embodiment.

Next, as illustrated in FIG. 6, a high-resistance conductive film 40a is formed, for example, by CVD (chemical vapor deposition) method, and the conductive film 40a is embedded in the trench TR1. This high-resistance conductive film 40a is also referred to as a semi-insulating film, being formed of, for example, semi-insulating SiN (SINSIN) or semi-insulating poly-crystalline silicon (SIPOS). The conductive film 40a has extremely high resistance, indicating that the conductive film 40a has such a material property that an infinitesimal amount of currents flows therethrough. For example, the resistivity of semi-insulating SiN (SINSIN) itself is approximately from $10^9$ to $10^{12}$ Ω·cm and the resistivity of semi-insulating poly-crystalline silicon (SIPOS) itself is approximately from $10^5$ to $10^9$ Ω·cm.

Figure 7:
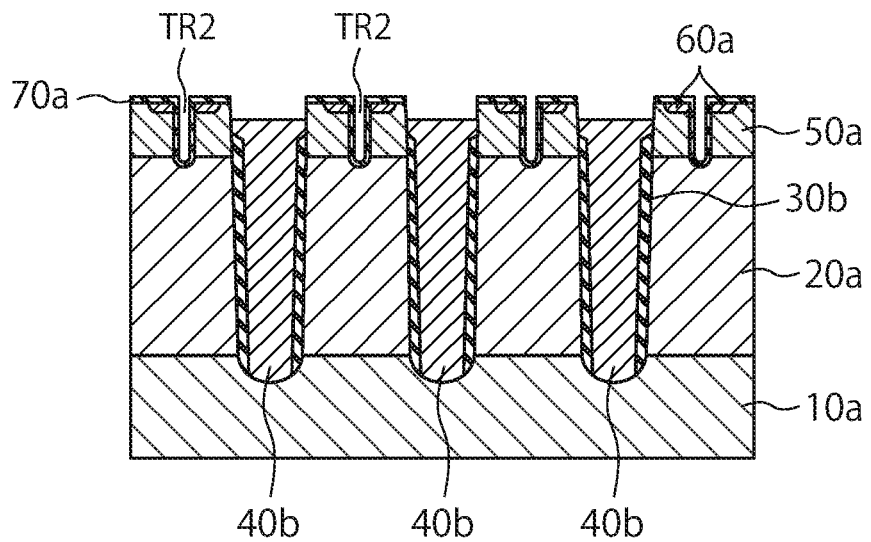
FIG. 7 is a cross-sectional view illustrating the manufacturing process of the semiconductor device according to the first embodiment.

Next, as illustrated in FIG. 7, the conductive film 40a is etched as a whole, for example, by RIE method, and the conductive film 40a on the surface of the n⁻-type semiconductor layer 20a is removed, while a conductive film 40b remains on the trench TR1, thereby exposing the surface of the n⁻-type semiconductor layer 20a. Next, the n⁻-type semiconductor layer 20a is treated to smooth its surface, for example, by CMP (chemical mechanical polishing) method.

Next, ion implantation of a p-type impurity is performed on the exposed surface of the n⁻-type semiconductor layer 20a, and the p-type impurity is activated to form a p-type semiconductor layer 50a. Next, ion implantation of an n-type impurity is partially performed on a surface of the p-type semiconductor layer 50a, and the n-type impurity is activated to form an n⁺-type semiconductor layer 60a. A trench TR2 is formed in a central portion of the n⁺-type semiconductor layer 60a so as to extend into the n⁻-type semiconductor layer 20a through the p-type semiconductor layer 50a. Next, an insulating layer 70a is formed on the surfaces of the p-type semiconductor layer 50a, the n⁺-type semiconductor layer 60a, and the trench TR2, for example, by thermal oxidation.

Figure 8:
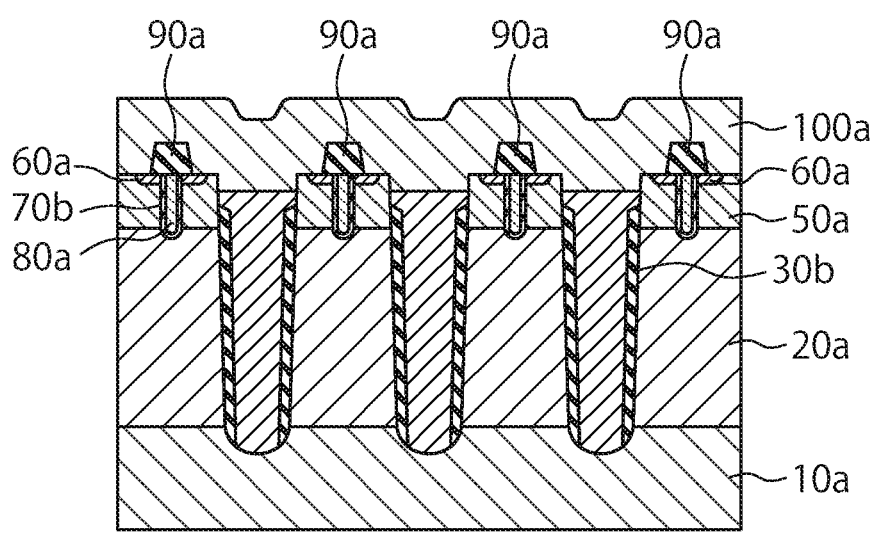
FIG. 8 is a cross-sectional view illustrating the manufacturing process of the semiconductor device according to the first embodiment.

Next, as illustrated in FIG. 8, an n⁺-type poly-crystalline silicon is embedded in the trench TR2, for example, by LPCVD method and etched back until its top surface is lower than a top surface of the p-type semiconductor layer 50a to form an n⁺-type poly-crystalline silicon 80a which is to be the gate region GT. Furthermore, an interlayer film is formed overall and it is patterned to form an interlayer film 90a on the n⁺-type poly-crystalline silicon 80a which is to be the gate region GT. Finally, a metal layer 100a that covers the insulating layer 90a is formed. The above process brings about the semiconductor device illustrated in FIG. 8.

A correspondence relationship between FIG. 8 and FIG. 1 is as follows. That is, the n⁺-type semiconductor layer 10a corresponds to the drain region D; the n⁻-type semiconductor layer 20a corresponds to the pillar PL; the sidewall oxide film 30b corresponds to the insulating film IN1; the conductive film 40b corresponds to the conductive film SIN; the p-type semiconductor layer 50a corresponds to the base region B; the n⁺-type semiconductor layer 60a corresponds to the source region S2; the insulating layer 70b corresponds to the gate insulating film GI; the semiconductor layer 80a corresponds to the gate region GT; the insulating layer 90a corresponds to the interlayer insulating film IN2; and the metal layer 100a corresponds to the source electrode S1.

As described above, according to the semiconductor device of this embodiment, the drain region D and the source electrode S1 are electrically connected by the electrical connection unit including the high-resistance conductive film SIN and the insulating film IN1 so that it is possible to form the equipotential distribution in the conductive film SIN, which makes it possible to draw the depletion layer formed in the pillar PL toward the drain region D. Therefore, the breakdown voltage of the MOSFET formed in the pillar PL can be enhanced, leading to achievement of a semiconductor device having a small on-resistance.

Furthermore, SINSIN (semi-insulating SiN) or SIPOS (semi-insulating poly-crystalline silicon), which is also referred to as a semi-insulating film having a high resistance value, is used as a material of the conductive film SIN so that the currents flowing through the conductive film SIN can be suppressed to an infinitesimal amount. Thus, it is possible to minimize an increase in power consumption.

Second Embodiment

In a second embodiment, a p-type semiconductor layer extending from a base region B toward a drain region D is formed in the periphery of the electrical connection unit according to the first embodiment that includes the conductive film SIN and the insulating film IN1 so that a depletion layer is formed between an n-type pillar PL and the p-type semiconductor layer to ensure a breakdown voltage, and simultaneously, to ensure the breakdown voltage by equipotential distribution of the electrical connection unit even with variation in n-type and p-type impurity concentrations. Hereinafter, differences from the first embodiment will be described.

Figure 9:
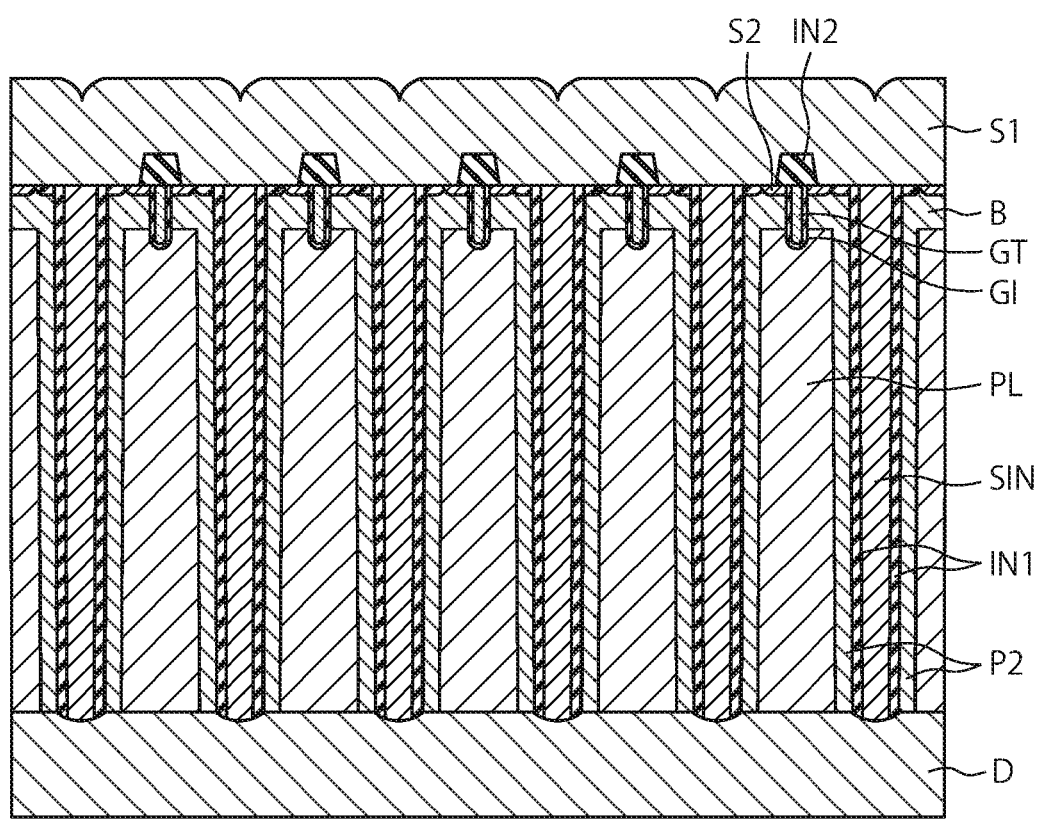
FIG. 9 is a view illustrating a configuration of a semiconductor device according to a second embodiment.

FIG. 9 is a cross-sectional view corresponding to FIG. 1 in the first embodiment, describing a configuration of a semiconductor device according to this embodiment. As illustrated in FIG. 9, the semiconductor device according to this embodiment includes a plurality of MOSFETs having a super-junction structure.

In this embodiment, a p-type semiconductor layer P2 is additionally formed in the periphery of the insulating film IN1 of the electrical connection unit. In this embodiment, the p-type semiconductor layer P2 is formed so as to connect the base region B and the drain region D. In other words, the base region B and the drain region D are connected by the semiconductor layer P2.

This p-type semiconductor layer P2 plays a role similar to that of a p-type pillar in a MOSFET with a conventional super-junction structure. In other words, the depletion layer is formed at an interface between the p-type semiconductor layer P2 and the n-type pillar PL so as to ensure the breakdown voltage of the MOSFET. Accordingly, it is required to manufacture the p-type semiconductor layer P2 and the n-type pillar PL, while strictly controlling impurity concentrations thereof.

If, by any chance, the depletion layer sufficient for ensuring the breakdown voltage is not formed between the p-type semiconductor layer P2 and the n-type pillar PL due to variation in the impurity concentrations of the p-type semiconductor layer P2 and the n-type pillar PL, the equipotential distribution is formed in the pillar PL by an infinitesimal amount of currents flowing through the conductive film SIN of the electrical connection unit so that the depletion layer of the pillar PL is drawn toward the drain region D.

As similar to the first embodiment, it is possible to ensure the breakdown voltage of the MOSFET.

As can be seen from the above, the pillar PL corresponds to a first semiconductor region according to this embodiment; the insulating film IN1 corresponds to a first insulating film according to this embodiment; the base region B corresponds to a second semiconductor region according to this embodiment; the semiconductor layer P2 corresponds to a third semiconductor region; and the gate insulating film GI corresponds to a second insulating film according to this embodiment. The n-type corresponds to a first conductivity type in this embodiment; and the p-type corresponds to a second conductivity type in this embodiment. Furthermore, the conductive film SIN and the insulating film IN1 are included in the electrical connection unit according to this embodiment; and the base region B, the source region S2, the gate region GT, and the pillar PL are included in the MOSFET according to this embodiment.

Hereinafter, a method for manufacturing the semiconductor device according to this embodiment will be described with reference to FIGS. 10 to 15. FIGS. 10 to 15 are cross-sectional views illustrating the manufacturing process of the semiconductor device according to this embodiment.

Figure 10:
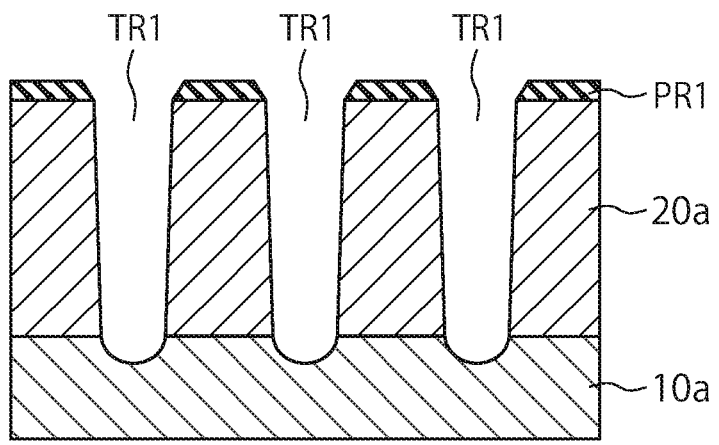
FIG. 10 is a cross-sectional view illustrating a manufacturing process of the semiconductor device according to the second embodiment.

First, as illustrated in FIG. 10, an n$^-$-type semiconductor layer 20a is formed on an n$^+$-type semiconductor layer 10a as similar to the first embodiment. Next, a photoresist layer PR1 is formed on the n$^-$-type semiconductor layer 20a, being patterned. Using this patterned photoresist layer PR1 as a mask, the n$^-$-type semiconductor layer 20a and the n$^+$-type semiconductor layer 10a are etched, for example, by RIE (reactive ion etching) method. Accordingly, a trench TR1 is formed. The trench TR1 extends into the n$^-$-type semiconductor layer 10a through the n$^+$-type semiconductor layer 20a. In other words, the n$^-$-type semiconductor layer 10a is exposed at the bottom of the trench TR1.

Figure 11:
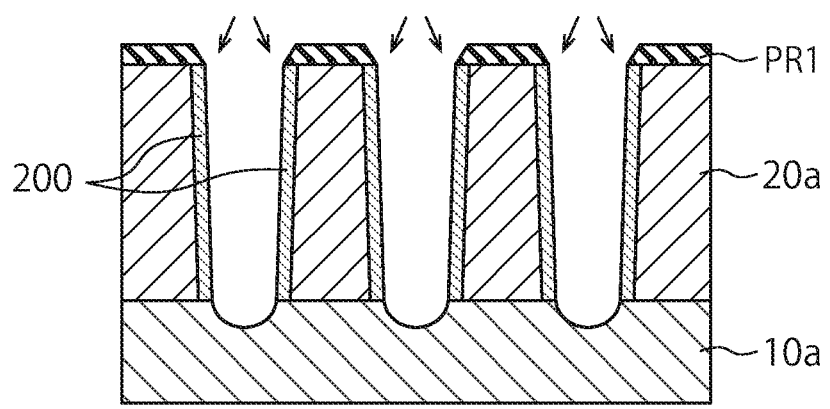
FIG. 11 is a cross-sectional view illustrating the manufacturing process of the semiconductor device according to the second embodiment.

Next, as illustrated in FIG. 11, a p-type semiconductor layer 200 is formed on a sidewall of the trench TR1. In this embodiment, for example, the p-type semiconductor layer 200 is formed by implantation of p-type ions into the n$^-$-type semiconductor layer 20a and activation of the same by heat treatment.

Figure 12:
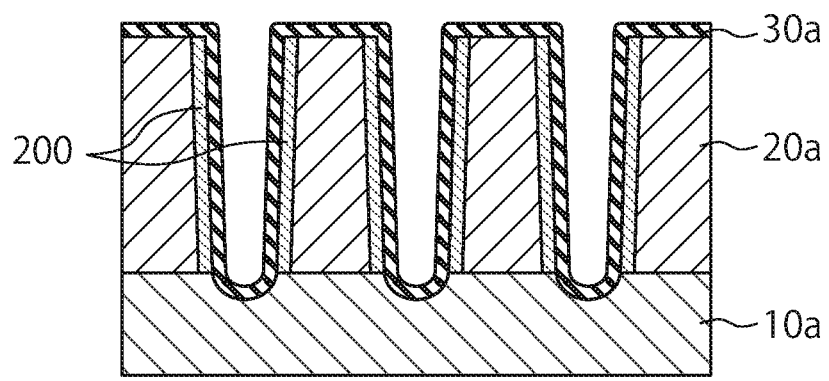
FIG. 12 is a cross-sectional view illustrating the manufacturing process of the semiconductor device according to the second embodiment.

Next, as illustrated in FIG. 12, the photoresist layer PR1 is removed, and a sidewall oxide film 30a is formed, for example, by thermal oxidation. Accordingly, the sidewall oxide film 30a is formed on a surface of the n$^-$-type semiconductor layer 20a and a surface of the n$^+$-type semiconductor layer 10a exposed at the bottom of the trench TR1 and a surface of the p-type semiconductor layer 200.

Figure 13:
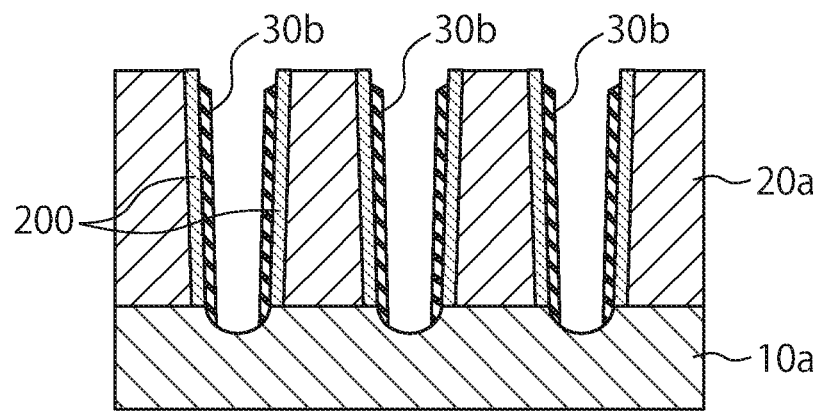
FIG. 13 is a cross-sectional view illustrating the manufacturing process of the semiconductor device according to the second embodiment.

Next, as illustrated in FIG. 13, the sidewall oxide film 30a is etched back, for example, by RIE and partially removed so as to form a sidewall oxide film 30b. In other words, the sidewall oxide film 30a formed on the upper surface of the n$^-$-type semiconductor layer 20a and the sidewall oxide film 30a formed at the bottom of the trench TR1 are removed by etching. Accordingly, the n$^+$-type semiconductor layer 10a is re-exposed at the bottom of the trench TR1.

Figure 14:
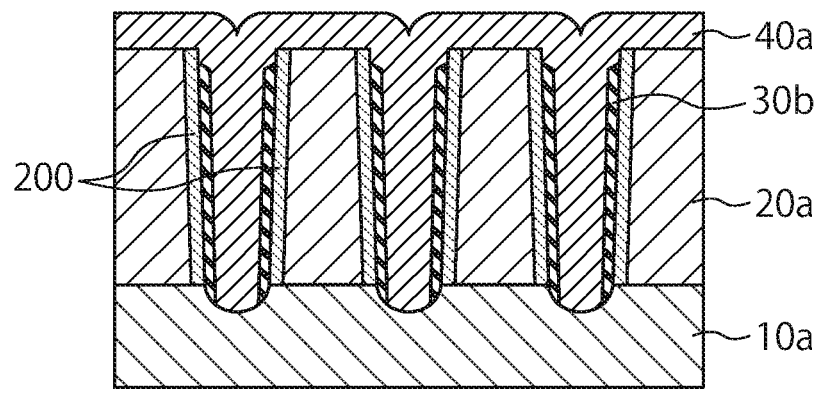
FIG. 14 is a cross-sectional view illustrating the manufacturing process of the semiconductor device according to the second embodiment.

Next, as illustrated in FIG. 14, a high-resistance conductive film 40a is formed in a similar manner and material as in the first embodiment, and the conductive film 40a is embedded in the trench TR1. Next, as illustrated in FIG. 15, a p-type semiconductor layer 50a, an n$^+$-type semiconductor layer 60a, an insulating layer 70a, an n$^+$-type semiconductor layer 80a, an insulating layer 90a, and a metal layer 100a are formed in a similar manner and material as in the first embodiment.

Figure 15:
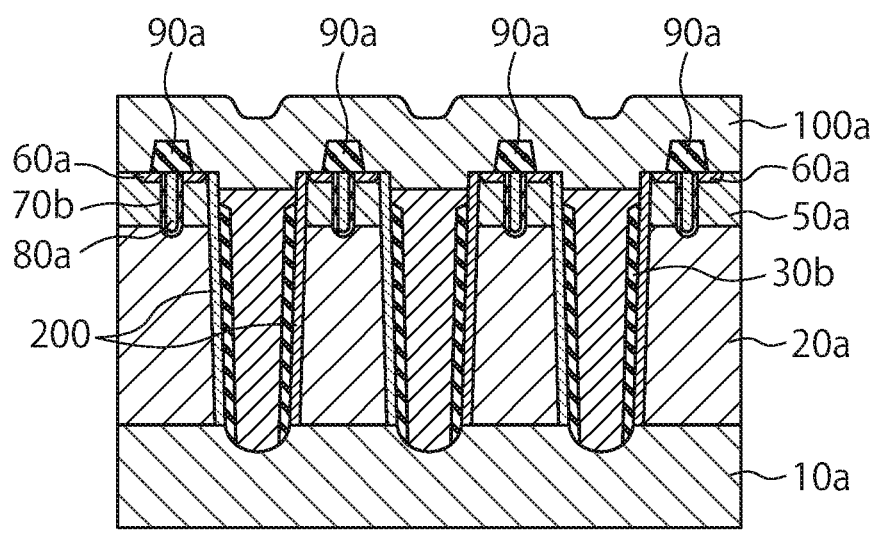
FIG. 15 is a cross-sectional view illustrating the manufacturing process of the semiconductor device according to the second embodiment.

A correspondence relationship between FIG. 15 and FIG. 9 is as follows. That is, the n$^+$-type semiconductor layer 10a corresponds to the drain region D; the n$^-$-type semiconductor layer 20a corresponds to the pillar PL; the sidewall oxide film 30b corresponds to the insulating film IN1; the conductive film 40b corresponds to the conductive film SIN; the p-type semiconductor layer 50a corresponds to the base region B; the n$^+$-type semiconductor layer 60a corresponds to the source region S2; the insulating layer 70b corresponds to the gate insulating film GI; the n$^+$-type semiconductor layer 80a corresponds to the gate region GT; the insulating layer 90a corresponds to the interlayer insulating film IN2; the metal layer 100a corresponds to the source electrode S1; and the semiconductor layer 200 corresponds to the semiconductor layer P2.

In such manners, according to the semiconductor device of this embodiment, the depletion layer is formed at the interface between the p-type semiconductor layer P2 and the n-type pillar PL so as to ensure the breakdown voltage of the MOSFET. As similar to the first embodiment, the equipotential distribution is then formed in the pillar PL by an infinitesimal amount of currents flowing through the conductive film SIN of the electrical connection unit, and the depletion layer of the pillar PL is drawn toward the drain region D. Therefore, it is possible to ensure the breakdown voltage of the MOSFET by these two depletion layers.

Furthermore, if, by any chance, the depletion layer is not sufficiently formed at the interface between the pillar PL and the semiconductor layer P2 due to variation in the n-type impurity concentration of the pillar PL and the p-type impurity concentration of the semiconductor layer P2, flowing the minute amount of currents through the conductive film SIN included in the electrical connection unit makes it possible to form the equipotential distribution in the conductive film SIN and to draw the depletion layer formed in the pillar PL toward the drain region D. Therefore, it is possible to ensure the breakdown voltage of the MOSFET even by this depletion layer of the pillar PL.

Figure 16:
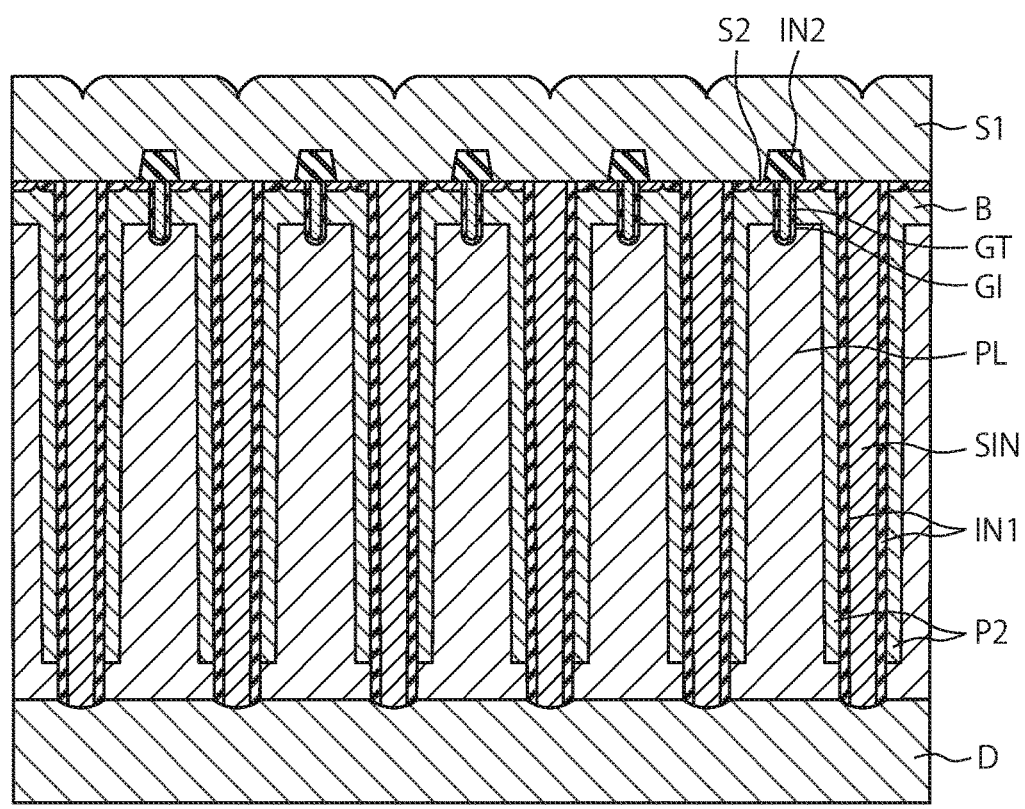
FIG. 16 is a cross-sectional view illustrating a modification of the semiconductor device according to the second embodiment.

As illustrated in FIG. 16, in the semiconductor device according to this embodiment, it should be noted that the p-type semiconductor layer P2 may not extend into the drain region D. In other words, an end portion of the semiconductor layer P2 close to the base region B is in contact with the base region B, but an end portion of the semiconductor layer P2 close to the drain region D may not be in contact with the drain region D.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In the first embodiment and the second embodiment, a semiconductor device including a plurality of MOSFETs has been illustrated as an example, but the semiconductor device may be configured to include one MOSFET, using the aforementioned technique.

The invention claimed is:

1. A semiconductor device, comprising:
   a drain region of a first conductivity type;
   a first semiconductor region of the first conductivity type on the drain region;
   a MOSFET on an upper part of the first semiconductor region;
   a source electrode configured to cover the MOSFET; and
   a pair of electrical connection units on both sides of the first semiconductor region, the electrical connection units being configured to electrically connect the drain region and the source electrode while being electrically insulated from the first semiconductor region,
   wherein each of the electrical connection units comprises:
   a conductive film configured to electrically connect the drain region and the source electrode; and
   a pair of first insulating films on both sides of the conductive film, the conductive film directly contacting the drain region.

2. The semiconductor device according to claim 1, wherein an electrical resistance of the conductive film is from $10^7\Omega$ to $10^{10}\Omega$.

3. The semiconductor device according to claim 1, wherein the conductive film includes semi-insulating SiN or semi-insulating poly-crystalline silicon.

4. The semiconductor device according to claim 1, wherein each of the electrical connection units is filled with the conductive film between the pair of first insulating films.

5. The semiconductor device according to claim 1, wherein the pair of first insulating films extend into the drain region.

6. The semiconductor device according to claim 1, wherein an impurity concentration of the first conductivity type of the first semiconductor region is lower than an impurity concentration of the first conductivity type of the drain region.

7. The semiconductor device according to claim 1, wherein an electrical resistance between the source electrode and the drain region of the electrical connection units is from $10^7\Omega$ to $10^{10}\Omega$.

8. The semiconductor device according to claim 1, wherein
   the MOSFET comprises:
   a second semiconductor region of a second conductivity type on the upper part of the first semiconductor region;
   a source region of the first conductivity type on an upper part of the second semiconductor region; and
   a gate region expending into the first semiconductor region through the source region and the second semiconductor region, the gate region being in contact with the source region, the first semiconductor region, and the second semiconductor region through a second insulating film.

9. A semiconductor device, comprising:
   a drain region of a first conductivity type;
   a first semiconductor region of the first conductivity type on the drain region;
   a second semiconductor region of a second conductivity type on an upper part of the first semiconductor region;
   a MOSFET in the first semiconductor region and the second semiconductor region;
   a source electrode configured to cover the MOSFET;
   a pair of electrical connection units formed on both sides of the first semiconductor region, the electrical connection units being configured to electrically connect the drain region and the source electrode while being electrically insulated from the first semiconductor region; and
   a third semiconductor region of the second conductivity type, configured to extend toward the drain region from the second semiconductor region in the periphery of each of the electrical connection units and reach the drain region.

10. The semiconductor device according to claim 9, wherein the third semiconductor region connects the second semiconductor region and the drain region.

11. The semiconductor device according to claim 9, wherein
    each of the electrical connection units comprises:
    a conductive film configured to electrically connect the drain region and the source electrode; and
    a pair of first insulating films on both sides of the conductive film.

12. The semiconductor device according to claim 11, wherein an electrical resistance of the conductive film is from $10^7\Omega$ to $10^{10}\Omega$.

13. The semiconductor device according to claim 11, wherein the conductive film includes semi-insulating SiN or semi-insulating poly-crystalline silicon.

14. The semiconductor device according to claim 11, wherein each of the electrical connection units is filled with the conductive film between the pair of first insulating films.

15. The semiconductor device according to claim 11, wherein the pair of first insulating films extends into the drain region.

16. The semiconductor device according to claim 9, wherein an impurity concentration of the first conductivity type of the first semiconductor region is lower than an impurity concentration of the first conductivity type of the drain region.

17. The semiconductor device according to claim 9, an electrical resistance between the source electrode and the drain region of the electrical connection units is from $10^7\Omega$ to $10^{10}\Omega$.

18. The semiconductor device according to claim 9, wherein
the MOSFET comprises:
the second semiconductor region of the second conductivity type on the upper part of the first semiconductor region;
a source region of the first conductivity type on an upper part of the second semiconductor region; and
a gate region penetrating into the first semiconductor region through the source region and the second semiconductor region, the gate region being in contact with the source region, the first semiconductor region, and the second semiconductor region through a second insulating film.

* * * * *